United States Patent
Baurand et al.

(10) Patent No.: US 6,441,605 B1
(45) Date of Patent: Aug. 27, 2002

(54) CURRENT SENSOR FOR AN ELECTRICAL DEVICE

(75) Inventors: Gilles Baurand; Vjekoslav Gladovic, both of Montesson-la-Borde; Jean-Christophe Cuny, Rueil-Malmaison; Patrick Lemarchand, Magnanville; Jean-Marie Trico, Asnieres sur Seine, all of (FR)

(73) Assignee: Schneider Electric Industries SA, Rueil-Malmaison (FR)

( * ) Notice: Subject to any disclaimer, the term of this patent is extended or adjusted under 35 U.S.C. 154(b) by 0 days.

(21) Appl. No.: 09/631,115

(22) Filed: Aug. 2, 2000

(30) Foreign Application Priority Data

Aug. 4, 1999 (FR) .............................. 99 10169

(51) Int. Cl.[7] .......................... G01R 19/00; G01R 33/12
(52) U.S. Cl. .................... 324/127; 324/117 R; 324/241
(58) Field of Search ............................ 324/117 R, 127, 324/126, 179, 246, 260, 348, 241

(56) References Cited

U.S. PATENT DOCUMENTS 3,617,874 A * 11/1971 Forster ....................... 324/241
4,746,891 A   5/1988  Zylstra
4,794,326 A   12/1988 Friedl
5,027,059 A   6/1991  de Montgolfier et al.
5,587,651 A   12/1996 Berkcan et al.
5,617,019 A   4/1997  Etter
5,834,934 A   11/1998 Baurand et al. ............ 324/127

FOREIGN PATENT DOCUMENTS

DE  196 06 445 A1  8/1996
FR  2.163.581       7/1973

* cited by examiner

Primary Examiner—N. Le
Assistant Examiner—Vincent Q. Nguyen
(74) Attorney, Agent, or Firm—Oblon, Spivak, McClelland, Maier & Neustadt, P.C.

(57) ABSTRACT

A current sensor for an electrical device including a primary circuit in which a primary current flows. A magnetic circuit includes two identical U-shaped elements between which two studs for air gaps are located. A secondary circuit includes two similar coils of a cylindrical shape, mounted in series and encircling the air gaps, wherein these two coils are made in a continuous way with only one winding operation without any electrical connection between both coils. The winding of the primary circuit encircles one of the two coils. The sensor is designed so that it may be adapted to several nominal ranges of primary current by varying the number of passages of the primary circuit between coils, the number of windings of the secondary circuit, and the thickness of the air gaps.

7 Claims, 2 Drawing Sheets

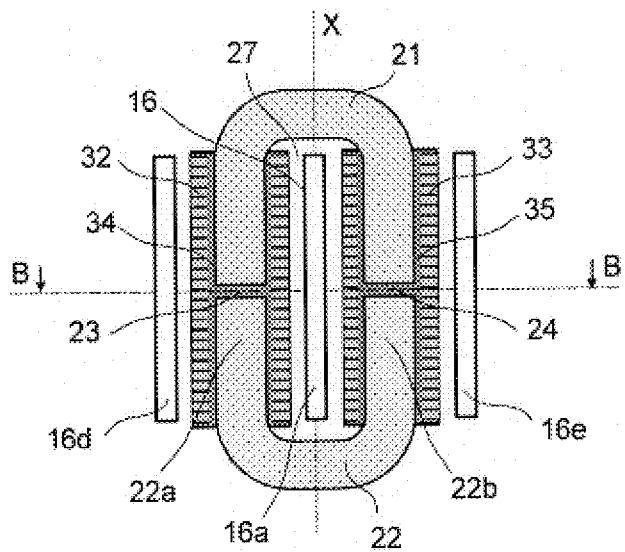
*FIG. 4*
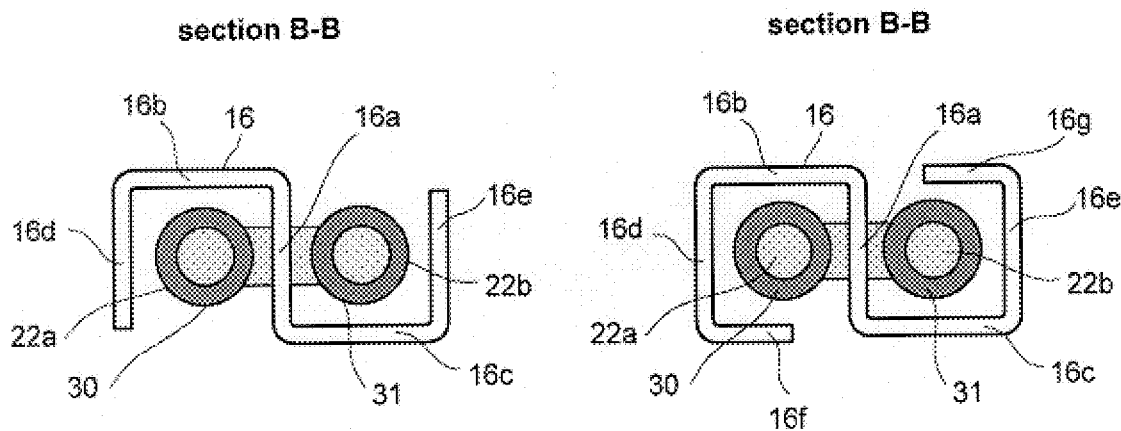
*FIG. 5*  *FIG. 6*

CURRENT SENSOR FOR AN ELECTRICAL DEVICE

BACKGROUND OF THE INVENTION

1. Field of the Invention

The present invention relates to a current sensor which may be used in electrical power devices such as breakers, power relays for providing thermal, magnetic or short circuit protection functions.

2. Discussion of the Background

Current sensors comprising a primary circuit wherein an electric current to be measured flows, a magnetic circuit with an air gap and a secondary circuit delivering a typical signal from the current to be measured, are well known.

Certain types of current sensors provide a magnetic circuit in the shape of a torus around which a secondary winding is wound acting as a magnetic field detector. This layout may lead to significant manufacturing costs for the secondary winding in relation to the torus shape of the magnetic circuit, as compared to a cylindrical shape.

Other types of current sensors have a magnetic circuit with only one air gap. Accordingly, they are more sensitive to possible perturbations arising from external magnetic fields, and may thus require metal shielding around the secondary winding or a specific electronic circuit downstream from the secondary winding in order to limit the effect of these perturbations. Furthermore, the sensor's dynamical range may then be reduced.

Finally, the document U.S. Pat. No. 5,617,019 describes a current sensor comprising a magnetic circuit consisting of two air gaps located between two U-shaped symmetrical parts and comprising two secondary coils placed either inside or around both air gaps. In this current sensor, the primary circuit only crosses the magnetic circuit once which makes the sensor less sensitive for low values of the primary current. Moreover, this sensor requires an information tap between the two coils, leading to a electrical connection point so requiring soldering, so that it may be used in an electronic processing downstream.

SUMMARY OF THE INVENTION

The object of the present invention is to produce a current sensor having good immunity to external magnetic fields, with reduced bulk, but especially covering a large adjustment range for the primary current and for which large mass production may be achieved in a simple way and in the most economical way possible.

According to the invention, the current sensor includes a primary circuit wherein an electrical current to be measured flows, a secondary circuit acting as a magnetic field detector and a magnetic circuit comprising two identical elements consisting of ferromagnetic material between which are located two air gaps with substantially equal thicknesses. This sensor is characterized by the fact that the secondary circuit includes two similar coils of a cylindrical shape, mounted in series, wherein each coil of the secondary circuit is positioned symmetrically relative to a median plane passing through the magnetic circuit air gaps and both coils are manufactured continuously by only one winding operation without any electrical connection between the two coils, which simplifies their mass production.

According to an advantageous embodiment of the invention, the magnetic circuit is made from a stretched profile with a circular cross-section. The primary circuit comprises an electrical conductor forming a cylinder-shaped winding of constant cross-section, encircling one of the two coils of the secondary circuit and symmetrically positioned with respect to the median plane, the conductor having a number of passages between the coils greater than 1.

The sensor is designed so that it may be adapted to several gauges of primary current by varying the number of passages of the primary current around the coils of the secondary circuit, the number of turns of the secondary circuit and the thickness of the air gaps, whilst maintaining a substantially linear and identical output signal, thus extending its use to the utmost and making it the most economical possible.

BRIEF DESCRIPTION OF THE DRAWINGS

The invention will now be described in more detail with reference to the exemplary embodiments and illustrated by the appended drawings wherein:

FIG. 4 shows another embodiment wherein the conductor of the primary circuit crosses the magnetic circuit with only one complete passage, FIGS. 5 and 6 show sectional views of examples for the shape of the primary circuit according to the embodiment of FIG. 4.

DESCRIPTION OF THE PREFERRED EMBODIMENTS

Figure 1:
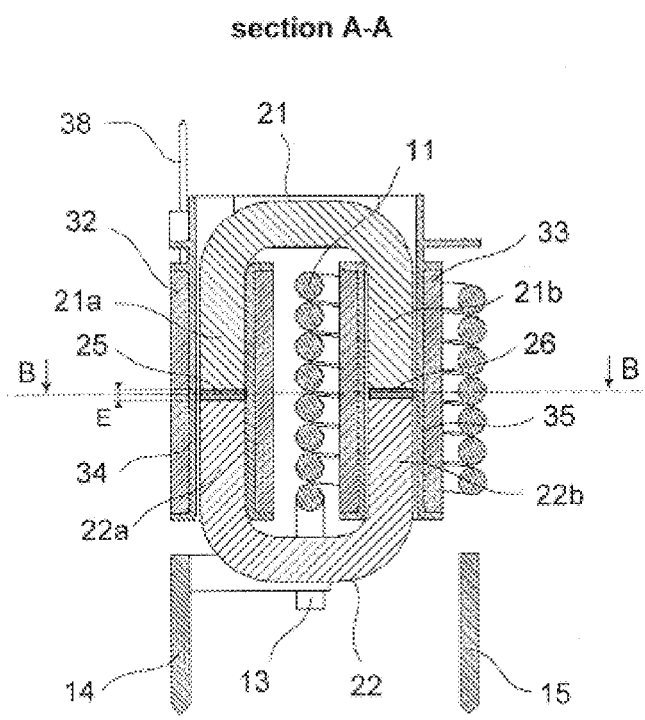
FIG. 1 shows a sectional view of an embodiment of the current sensor according to the invention.
Figure 2:
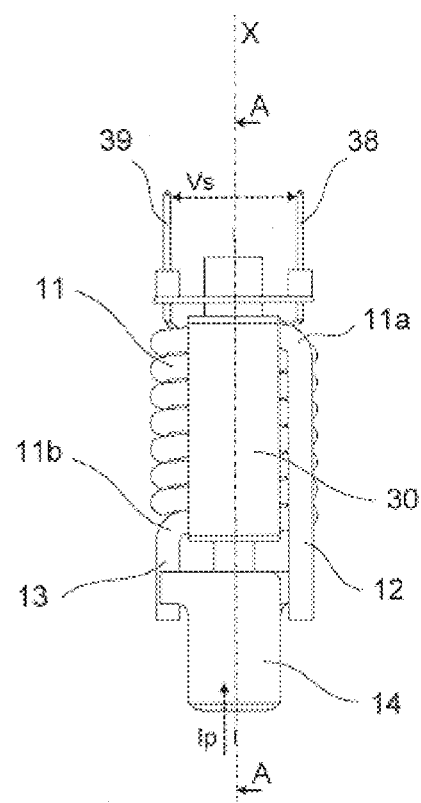
FIG. 2 is a side view according to the same embodiment, FIG. 3 details a connection diagram of the secondary circuit.

The current sensor illustrated in FIG. 1 may be used in any electrical power switching device of the type contactor/breaker, breaker or any other type for providing thermal, magnetic or short circuit protection functions. An electrical device may include one or more current sensors as described in the invention (typically one sensor per phase for example). The current sensor has a magnetic circuit which includes two identical elements 21, 22 in a shape of a U with rounded angles. These two elements 21, 22 are preferably made from a stretched profile with a circular cross-section which makes their manufacturing very economical. Each element 21, 22 has two right parallel branches with a cylindrical shape 21a, 21b and 22a, 22b respectively, with substantially equal lengths and cross-sections. These two elements 21, 22 are positioned face to face so that both branches 21a, 22a on the one hand and 21b, 22b on the other hand are aligned and co-planar. The magnetic circuit also includes two air gaps 23, 24 which are embodied by two identical studs 25, 26, made of a non-magnetic material, of thickness E and of circular cross-section approximately equal to the cross-section of elements 21, 22. These studs 25, 26 are placed on the ends of branches 21a, 22a and 21b, 22b respectively, so that the elements 21, 22 abut against these studs.

The circular cross-section and the rounded angles of the U-shape of elements 21, 22 of the magnetic circuit have the advantage of substantially reducing, as compared to a rectangular or square cross-section, the electrodynamic stresses on the primary circuit, especially upon occurrence of a short circuit current. The use of a stretched profile simplifies the manufacturing operations for the magnetic circuit and further, it is impossible to obtain a circular section for elements 21, 22 by using a succession of foils stacked and assembled together.

Besides, the material used for both elements 21, 22 of the magnetic circuit has a high magnetic permeability, a very linear behavior on an extended range of its magnetic induction versus the magnetic field, i.e. including a very narrow hysteresis cycle and a high saturation induction. A iron-nickel alloy with at least 36% nickel and having undergone a magnetic annealing operation meets these requirements for an acceptable cost.

The secondary circuit includes two similar coils 32, 33 of a cylindrical shape, including an equal number of turns Ns of a thin enameled conductive wire and homogeneously distributed on two formers 34, 35 of low thickness, also with a cylindrical shape, respectively, thus forming two cylindrical subsets 30, 31. The subset 30 encircles branch 21a, air gap 23 and branch 22a of the magnetic circuit and the subset 31 encircles branch 21b, air gap 24 and branch 22b of the magnetic circuit. The subsets 30, 31 are symmetrically positioned relatively to a horizontal median plane B—B crossing both air gaps 23, 24 and are parallel to a vertical axis X orthogonal to this median plane B—B.

Figure 3:
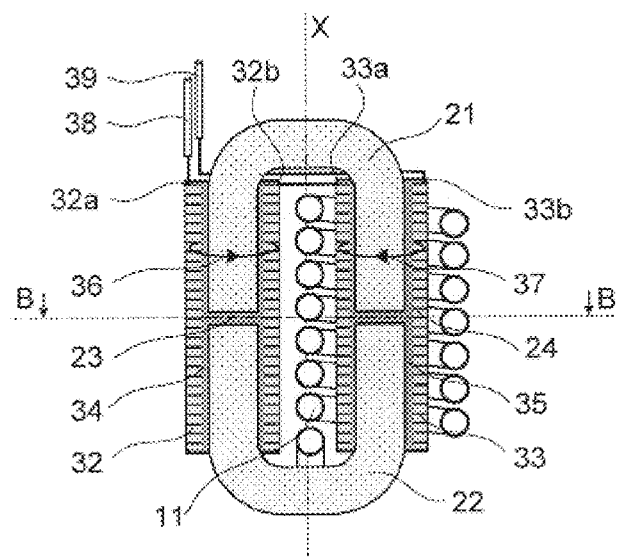

At the output of the secondary circuit, two connectors 38, 39 located in a direction substantially parallel to the vertical axis X, are for recovering an output signal Vs supplied by the sensor. FIG. 3 shows an example of a connection diagram for the secondary circuit wherein connector 38 is connected to the end 32a of the coil 32, connector 39 is connected to end 33b of the coil 33. The cylindrical shape of this coil 32, 33 as compared with a toric shape for example, has the advantage of substantially simplifying the making of the winding.

As indicated by arrows 36, 37 in FIG. 3, both coils 32, 33 are positioned in series with an opposite winding direction in order to approach the magnetic behavior of a torus, while keeping a simple manufacturing method, and so as to cancel out the influence of external magnetic fields by differential compensation, contrary to what would be obtained with a magnetic circuit having only one air gap. Moreover, it is advantageous to achieve an even number of winding layers for each subset 30, 31 so as to promote this differential compensation effect of external magnetic fields.

Actually both coils 32, 33 are similar to one single winding physically distributed in an identical way around both cylindrical formers 34, 35 in order to form both subsets 30, 31. This winding is made in a continuous way by one single winding operation around the cylindrical formers 34, 35, wherein their circular cross-section has the advantage of reducing the stresses which may occur on the conductive wire of the secondary circuit during the winding. As the winding operation is performed continuously, an electrical connection between coils 32, 33 is not required, so this avoids any soldering between the coils. Thus, only two solder bonds (for connecting connectors 38 and 39) are required for making the secondary circuit, whereas three or four solder bonds would be necessary if both coils 32, 33 were manufactured separately then connected in series, or if there was a need of tapping information at the middle point of the two coils, e.g. for use in electronic processing downstream from the sensor.

According to the embodiment of FIG. 1, the primary circuit comprises an electrical conductor forming a cylindrical winding 11 of constant section, positioned around one of the two coils 32, 33 of the secondary circuit and symmetrically with respect to the median plane B—B. The number Np of passages of the primary conductor between coils 32, 33 is greater than 1, thus forming at least one turn. At ends 11a and 11b of winding 11, the primary circuit is extended through two straight segments 12 and 13 of the electrical conductor, respectively, positioned on both sides of a vertical plane A—A, along the vertical axis X, in such a way that both segments 12 and 13 may be connected through appropriate means to connectors 14 and 15 of the primary circuit, respectively. These conductors 14 and 15 are symmetrical relatively to the vertical plane A—A and are directed along the vertical axis X but in an opposite direction to connectors 38, 39 of the secondary circuit. The number Np of passages is variable so that it may be adapted to a wide adjustment range of the primary current Ip.

In another embodiment simplified in FIG. 4 and corresponding to the use of the sensor for large values of the primary current Ip, the number Np of passages of the primary circuit between coils 32, 33 is equal to 1, the latter thus not forming a complete turn. The winding 11 of the primary circuit is replaced by a flat conductor 16 including a first vertical plate 16a, parallel to vertical axis X, orthogonal relative to the vertical plane A—A and with a height approximately equal to the height of the coil 32, 33 of the secondary circuit. This first plate 16a directly crosses a gap 27 located between the two coils 32, 33 at equal distance from the air gaps 23, 24 of the magnetic circuit and symmetrically relative to the median plane B—B.

The positioning of the flat conductor 16 around coils 32, 33 of the secondary circuit influences the linearity of the output signal from the current sensor. FIGS. 5 and 6 thus show two possible and non-limiting positioning examples, wherein the conductor 16 partially encircles coils 32, 33 of the secondary circuit which imparts better linearity over the whole measuring range to the current sensor. In FIG. 5, the first vertical plate 16a is extended through two other vertical plates 16b, 16c orthogonal relatively to plate 16a, then at the ends of these plates 16b, 16c through two new vertical plates 16d, 16e, orthogonal relatively to plates 16b, 16c in order to partially encircle each coil 32, 33 of the secondary circuit, whereby conductor 16 assumes the shape of an S or a Z according to the cross-sectional plane B—B. In FIG. 6, plates 16d, 16e are themselves extended through two new vertical plates 16f, 16g, orthogonal relatively to plates 16d, 16e and parallel to plates 16b, 16c but with a shorter width, so as to encircle the coils 32, 33 of the secondary circuit more completely. Plates 16a, 16b, 16c, 16d, 16e, 16f and 16g are all symmetric relative to the median plane B—B and they have substantially equal heights.

One of the objects of the sensor discussed in the present invention, is the potential of being implemented on several gauges of power electrical devices so as to cover the widest adjustment range for the primary current Ip, whilst maintaining a substantially linear and identical output signal level Vs for all the considered gauges, so that electronic processing located downstream from the sensor, is made independent of gauge, so as to simplify design and manufacturing. For this, the principle used notably allows for modulation of several parameters:

the number Np of passages of winding 11 of the primary circuit around coils 32, 33, the thickness E of the studs 25, 26 of the magnetic circuit's air gaps, the number Ns of turns for the coils 32, 33 of the secondary circuit.

These three parameters are directly involved in the proportionality coefficient which exists between the output signal Vs of the sensor and the derivative of the primary current Ip. So when the number Np increases, the signal Vs increases, also when the number Ns increases, the signal Vs increases, however when the thickness E increases, the signal Vs decreases. By varying these parameters according to the gauges in an appropriate way, an output signal Vs may thereby be obtained, substantially identical for various Ip current adjustment ranges.

In an electrical device of the breaker or contactor/breaker type, the adjustment range for the primary current corresponds to the range which a user may adjust for his application, between the effective value of a minimum current Imin and the effective value of a maximum current Imax. Especially owing to the material used in the magnetic circuit, in the present invention, it is possible to obtain a large difference between Imin and Imax, such as Imax= 4*Imin which has the advantage of providing greater flexibility of use for a given range. To ensure thermal protection, a current sensor should be capable of measuring the primary current Ip from 0.5*Imin. To ensure magnetic protection and triggering on a short circuit, a current sensor should be capable of performing a measurement up to 18*Imax. Therefore, for a given nominal range and for an adjustment range of the sensor equal to 4, the measurement range for the current sensor is equal to 144.

While maintaining the same electronic processing downstream from the sensor, the table hereafter shows an example of various adjustment ranges for the effective value of the primary current Ip, corresponding to various gauges of electrical devices, which a current sensor according to the invention would be able to cover by varying the number Np of passages of the primary circuit between coils 32, 33, the number Ns of turns of the secondary winding and thickness E of studs 25, 26 of the air gaps.

| Range Imin–Imax (A) | Np | Ns | E (mm) |
|---|---|---|---|
| 0.1–0.4 | 8 | 2400 | 0.2 |
| 0.35–1.4 | 8 | 1400 | 0.65 |
| 1.25–5 | 3 | 1400 | 0.65 |
| 3–12 | 2 | 1400 | 0.65 |
| 4.5–18 | 1 | 1200 | 1 |
| 8–32 | 1 | 1400 | 3 |

Finally, for this type of sensor, the delivered output signal Vs should notably be integrated by electronic processing downstream in order to be able to work on a signal proportional to the primary current. In the present invention, this electronic processing is solely achieved through passive RC type components without using any active integrating component. Sufficient results are obtained with this configuration, moreover the usually different frequencies of primary currents (typically 50 Hz or 60 Hz) may be compensated in a natural way.

It is to be understood that alternatives and improvements of details and even the use of equivalent means may be devised without departing from the scope of the present invention.

What is claimed is:

1. A current sensor, configured to be implemented in an electric device for providing thermal, magnetic and short circuit protection functions, comprising:
    a primary circuit in which an electrical current to be measured flows, said primary circuit intersecting with a magnetic flux of said current sensor;
    a secondary circuit acting as a magnetic field detector; and
    a magnetic circuit comprising two identical opposed elements each having first and second parallel branches, said first branches of each element opposing one another and said second branches of each element opposing one another, and each said element composed of a ferromagnetic material;
    air gaps with substantially equal thickness each located between corresponding branches of said elements,
    wherein the secondary circuit includes two coils with several turns, with a cylindrical shape, connected in series,
    wherein each coil of the secondary circuit is symmetrically positioned with respect to portions thereof on either side of a median plane passing through the air gaps, wherein both coils are made of a same continuous filament with only one wire formed in only one winding operation, and
    wherein the primary circuit comprises an electrical conductor forming a winding of a cylindrical shape of constant cross-section, encircling one of the two coils of the secondary circuit and positioned symmetrically with respect to portions of said winding on either side of the median plane, wherein the electrical conductor of the primary circuit has a number of passages between the coils greater than 1.

2. The current sensor according to claim 1, wherein each of said two elements are made up from a stretched profile of circular cross-section composed of iron-nickel alloy with a minimum of 36% nickel and on which a magnetic annealing operation is performed.

3. An electrical device that includes at least one current sensor according to claim 1.

4. The current sensor according to claim 1, wherein the primary circuit comprises a flat conductor having a first vertical plate orthogonal to the median plane, with a height substantially equal to the height of the coils of the secondary circuit, directly crossing a gap located between both coils of the secondary circuit, at an equal distance from both air gaps of the magnetic circuit and symmetrically with respect to portions of said conductor on either side of the median plan.

5. The current sensor according to claim 4, wherein the flat conductor of the primary circuit is extended, on each side of the first vertical plate, by at least two vertical additional plates orthogonal to the median plane, wherein each of these vertical plates is connected orthogonally to the adjacent vertical plate in order to partially encircle both coils of the secondary circuit.

6. The current sensor according to claim 1, wherein, by varying the number of passages of the primary circuit around the coils of the secondary circuit, the number of turns of the secondary circuit and the thickness of the air gaps, the current sensor is configured to deliver a substantially linear and identical output signal for various adjustment ranges of the primary current whereby this sensor can be implemented in several gauges of electrical devices.

7. The current sensor according to claim 6, wherein said sensor may be implemented in several gauges of electrical devices covering adjustment ranges of the primary current from 0.1 A to 32 A.

* * * * *